(12) United States Patent
Song

(10) Patent No.: US 10,184,976 B2
(45) Date of Patent: Jan. 22, 2019

(54) TESTING CIRCUIT BOARD WITH SELF-DETECTION FUNCTION AND SELF-DETECTION METHOD THEREOF

(71) Applicants: Inventec (Pudong) Technology Corporation, Shanghai (CN); Inventec Corporation, Taipei (TW)

(72) Inventor: Ping Song, Shanghai (CN)

(73) Assignee: INVENTEC (PUDONG) TECHNOLOGY CORPORATION (TW)

(*) Notice: Subject to any disclaimer, the term of this patent is extended or adjusted under 35 U.S.C. 154(b) by 38 days.

(21) Appl. No.: 15/622,964

(22) Filed: Jun. 14, 2017

(65) Prior Publication Data

US 2018/0164368 A1    Jun. 14, 2018

(30) Foreign Application Priority Data

Dec. 12, 2016    (CN) .......................... 2016 1 1142452

(51) Int. Cl.
*G01R 31/28*    (2006.01)
*G01R 31/3177*    (2006.01)
*G01R 31/317*    (2006.01)

(52) U.S. Cl.
CPC ..... *G01R 31/2884* (2013.01); *G01R 31/2808* (2013.01); *G01R 31/2815* (2013.01); *G01R 31/3177* (2013.01); *G01R 31/31701* (2013.01); *G01R 31/31723* (2013.01); *G01R 31/31727* (2013.01)

(58) Field of Classification Search
CPC ................ G01R 31/28; G01R 31/2808; G01R 31/2815; G01R 31/2884; G01R 31/3177; G01R 31/31701; G01R 31/31727; G01R 31/31723; G01R 31/3185

See application file for complete search history.

(56) References Cited

U.S. PATENT DOCUMENTS

| | | | | |
|---|---|---|---|---|
| 5,757,820 A | * | 5/1998 | Angelotti | G01R 31/31855 714/738 |
| 5,805,608 A | * | 9/1998 | Baeg | G01R 31/2884 714/726 |
| 2016/0306011 A1 | * | 10/2016 | Athimolom | G01R 31/318597 |

* cited by examiner

*Primary Examiner* — Shelly A Chase
(74) *Attorney, Agent, or Firm* — David R. Stevens; Stevens Law Group

(57) ABSTRACT

The present disclosure illustrates a testing circuit board with self-detection function and a self-detection method. A test for a to-be-tested circuit board is executed and a self-detection for a testing circuit board is performed by a JTAG chip. After the self-detection is passed, a first JTAG connection interface and a second JTAG connection interface are conducted by a controller, a multiplexer and a switch chip, to connect test circuit boards in series. Therefore, the efficiency of solving self-detection of JTAG chip with series connection conveniently and quickly may be achieved.

10 Claims, 6 Drawing Sheets

TESTING CIRCUIT BOARD WITH SELF-DETECTION FUNCTION AND SELF-DETECTION METHOD THEREOF

CROSS-REFERENCE TO RELATED APPLICATION

This application claims the benefit of Chinese Patent Application No. 201611142452.9, filed Dec. 12, 2016.

BACKGROUND OF THE INVENTION

1. Field of the Invention

The present disclosure relates to a testing circuit board and a self-detection method thereof, more particularly to a testing circuit board using a joint test action group (JTAG) chip to detect a to-be-tested circuit board and perform self-detection, and after the self-detection is passed, a first JTAG connection interface is conducted with a second JTAG connection interface through a controller, a multiplexer and a switch chip, thereby connecting the testing circuit boards in series, and a self-detection method thereof.

2. Description of the Related Art

In the circuit board detection technology, boundary scan technology is applied more and more widely. Actually, in order to implement the boundary scan technology, multiple testing circuit boards are connected in series to form a joint test action group (JTAG) chain to perform a large quantity of tests on the JTAG connection interface.

When the multiple testing circuit boards are connected in series, multiple JTAG signals of the joint test action group chips are in communication, that is, a test clock (TCK) signal and a test mode selection (TMS) signal are communicated in parallel, and a test data input (TDI) signal and a test data output (TDO) signal are communicated in series, so as to form the joint test action group chain to perform a large quantity of tests on the joint test action group connection interface.

However, in existing testing architecture, if a failure of a JTAG chip occurs in the JTAG chain, it is very difficult to find which JTAG chip is faulty, and it will take a lot of detection time to find the faulty JTAG chip if necessary.

Therefore, what is need is to develop a testing circuit board and a self-detection method to solve the conventional technology problem that existing series connection of the JTAG chip is inconvenient and time-consuming to detect faulty chip.

SUMMARY OF THE INVENTION

In order to solve the conventional technology problem that existing series connection of the JTAG chip is inconvenient and time-consuming to detect a faulty chip, the present disclosure is to provide a testing circuit board with self-detection function, and a self-detection method.

According to an embodiment, the present disclosure provides a testing circuit board with self-detection function, and the testing circuit board includes a first joint test action group (JTAG) connection interface, a JTAG chip, a controller, a multiplexer, a switch chip, a buffer, a second JTAG connection interface, and a test connection interface.

The first JTAG connection interface includes a first test clock (TCK) pin, a first test mode selection (TMS) pin, a first test data input (TDI) pin and a first test data output (TDO) pin. The second JTAG connection interface includes a second TCK pin, a second TMS pin, a second TDI pin and a second TDO pin.

The first JTAG connection interface is configured to be electrically coupled to a JTAG controller or other testing circuit board. The JTAG chip is electrically coupled to the first TCK pin, the first TMS pin and the first TDI pin. A JTAG controller controls the JTAG chip to perform self-detection of the testing circuit board, and when the testing circuit board passes the self-detection, the JTAG chip generates a communication signal. The controller is electrically coupled to the JTAG chip. The multiplexer is electrically coupled to a data output pin of the JTAG chip and the controller. In default setting, the first TDO pin is electrically coupled to the data output pin of the JTAG chip through the multiplexer. The switch chip is electrically coupled to the first TDO pin, the controller and the multiplexer. The buffer is electrically coupled to the first TCK pin and the first TMS pin. The second JTAG connection interface is configured to be electrically coupled to the first JTAG connection interface of other testing circuit board. The second TCK pin and the second TMS pin are electrically coupled to the buffer, the second TDI pin is electrically coupled to the multiplexer, and the second TDO pin is electrically coupled to the switch chip. The test connection interface is electrically coupled to the JTAG chip and a to-be-tested circuit board separately. The JTAG chip detects the to-be-tested circuit board through the test connection interface.

When the JTAG chip generates the communication signal, the controller receives the communication signal from the JTAG chip to generate a selection (SEL) signal, and the multiplexer breaks electrical connection between the first TDO pin and the data output pin of the JTAG chip, and conducts the second TDI pin with the data output pin of the JTAG chip according to the SEL signal, and the switch chip conducts the first TDO pin with the second TDO pin according to the SEL signal, so that the first JTAG connection interface is conducted with the second JTAG connection interface, the testing circuit board and the other testing circuit board are connected in series through the first JTAG connection interface and the second JTAG connection interface.

According to an embodiment, the present disclosure provides a self-detection method for a testing circuit board with self-detection function, and the self-detection method includes following steps: providing a testing circuit board which comprises a first joint test action group (JTAG) connection interface, a JTAG chip, a controller, a multiplexer, a switch chip, a buffer, a second JTAG connection interface and a test connection interface; in the first JTAG connection interface, providing a first test clock (TCK) pin, a first test mode selection (TMS) pin, a first test data input (TDI) pin and a first test data output (TDO) pin; in the second JTAG connection interface, providing a second TCK pin, a second TMS pin, a second TDI pin and a second TDO pin; next, electrically coupling the first JTAG connection interface to a JTAG controller or a second JTAG connection interface of other testing circuit board; electrically coupling the JTAG chip to the first TCK pin, the first TMS pin and the first TDI pin; next, electrically coupling the controller to the JTAG chip; next, electrically coupling the multiplexer to the controller and a data output pin of the JTAG chip, wherein in default setting, the first TDO pin is electrically coupled to the data output pin of the JTAG chip through the multiplexer; electrically coupling the switch chip to the first TDO pin, the controller and the multiplexer; electrically coupling the buffer to the first TCK pin and the first TMS pin;

electrically coupling the second TCK pin and the second TMS pin to the buffer, electrically coupling the second TDI pin to the multiplexer, and electrically coupling the second TDO pin to the switch chip; electrically coupling the test connection interface to the JTAG chip and a to-be-tested circuit board separately; controlling, by the JTAG controller, the JTAG chip to detect the to-be-tested circuit board through the test connection interface; next, controlling, by the JTAG controller, the JTAG chip to perform self-detection of the testing circuit board; generating a communication signal by the JTAG chip when the testing circuit board passes the self-detection; next, in the controller, receiving the communication signal from the JTAG chip to generate a selection (SEL) signal; breaking, by the multiplexer, electrical connection between the first TDO pin and the data output pin of the JTAG chip according to the SEL signal, and conducting, by the multiplexer, the second TDI pin with the data output pin of the JTAG chip, and conducting, by the switch chip, the first TDO pin with the second TDO pin according to the SEL signal, thereby conducting the first JTAG connection interface with the second JTAG connection interface, and connecting the testing circuit board and the other testing circuit board in series through the first JTAG connection interface and the second JTAG connection interface.

According above content, the difference between the present disclosure and the conventional technology is that the testing circuit board and self-detection method thereof of the present disclosure use the JTAG chip to detect the to-be-tested circuit board and perform the self-detection of the testing circuit board, and when the testing circuit board passes the self-detection, the first JTAG connection interface is conducted with the second JTAG connection interface through the controller, the multiplexer and the switch chip, to connect with the testing circuit board in series.

By using above technical means, a technical effect of conveniently and quickly connecting the JTAG chip in series for self-detection may be achieved.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
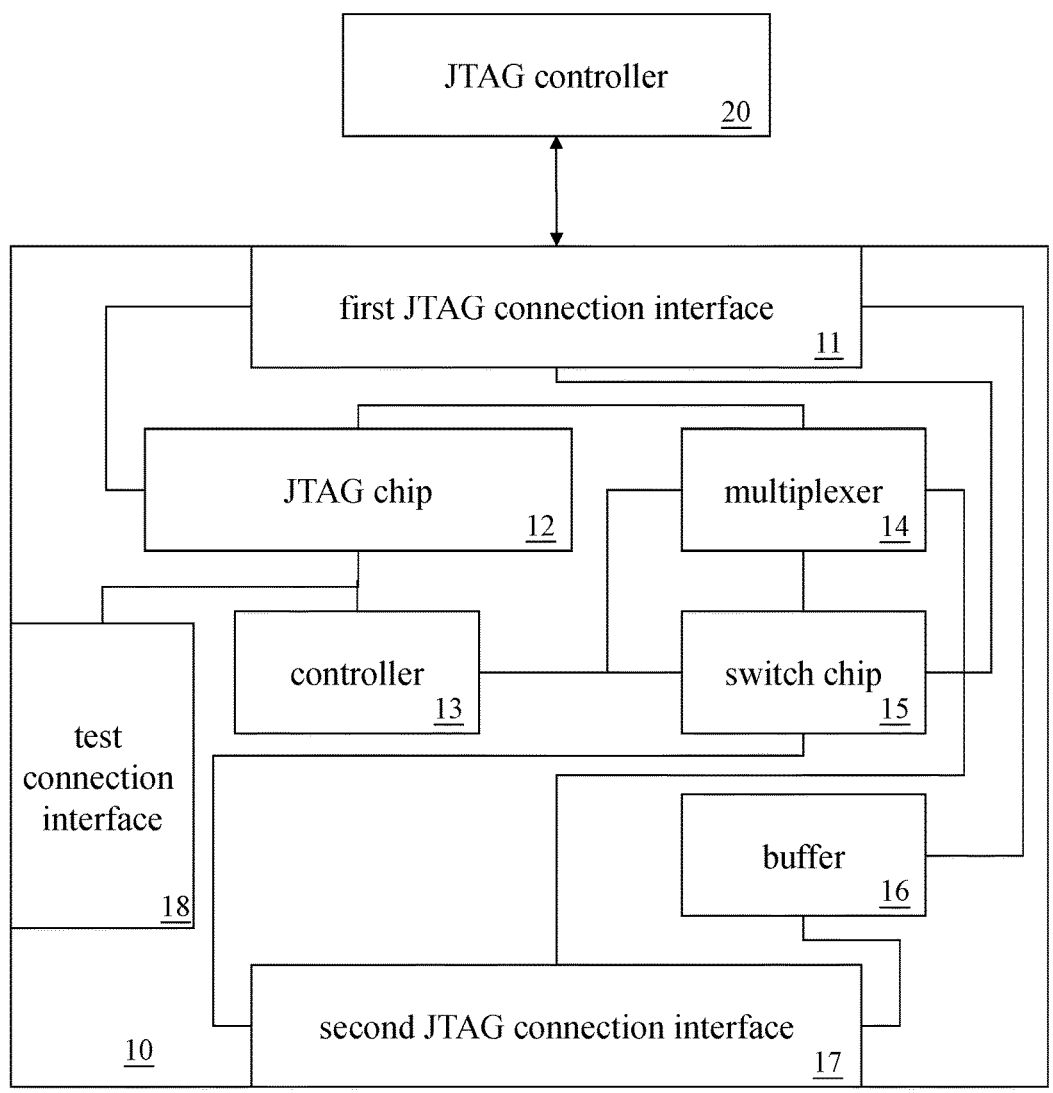
FIG. 1 is a block diagram of a testing circuit board with self-detection function, in accordance with the present disclosure.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 2:
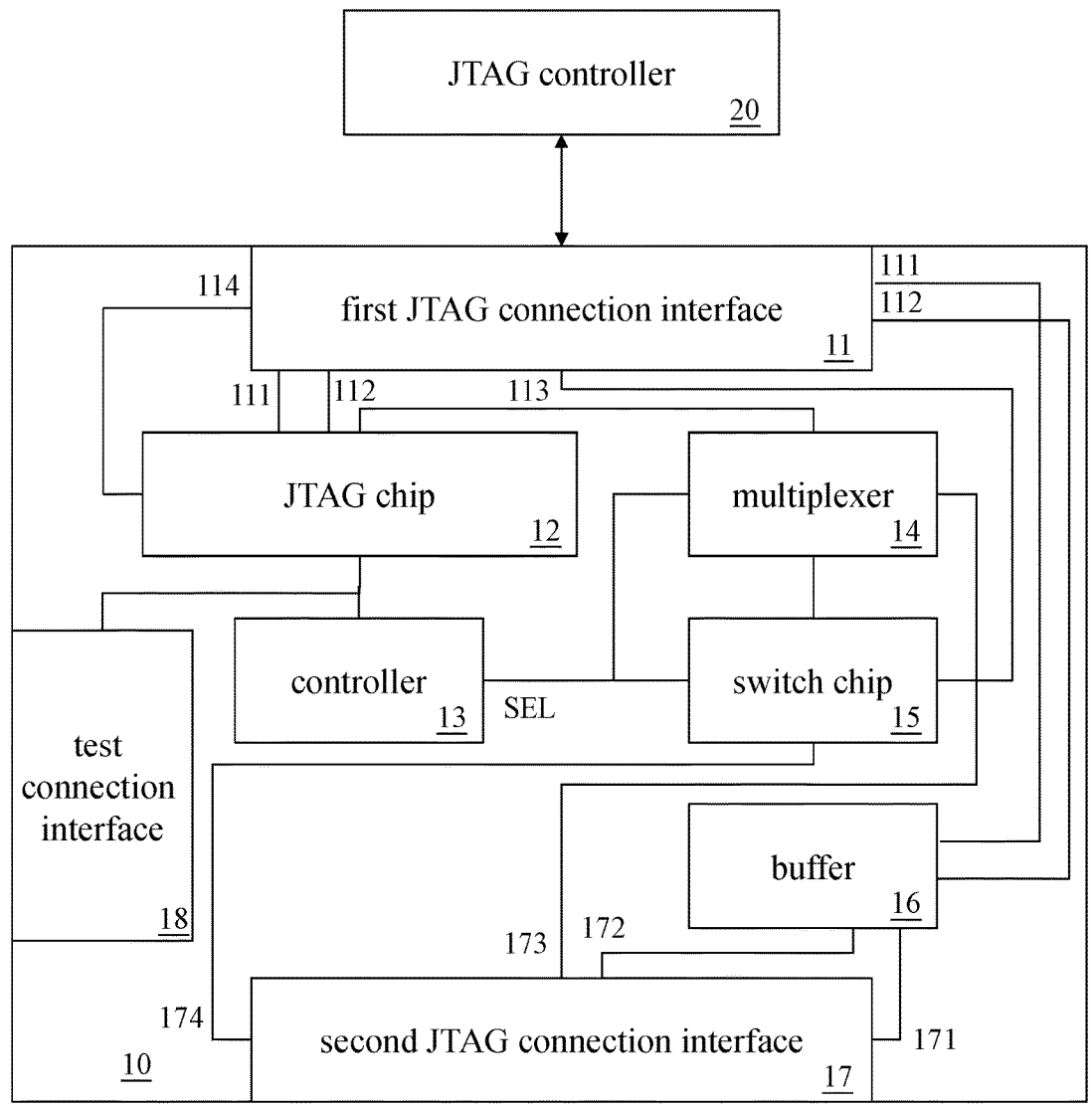
FIG. 2 is a circuit schematic diagram of the testing circuit board with the self-detection function, in accordance with the present disclosure.
Figure 3A:
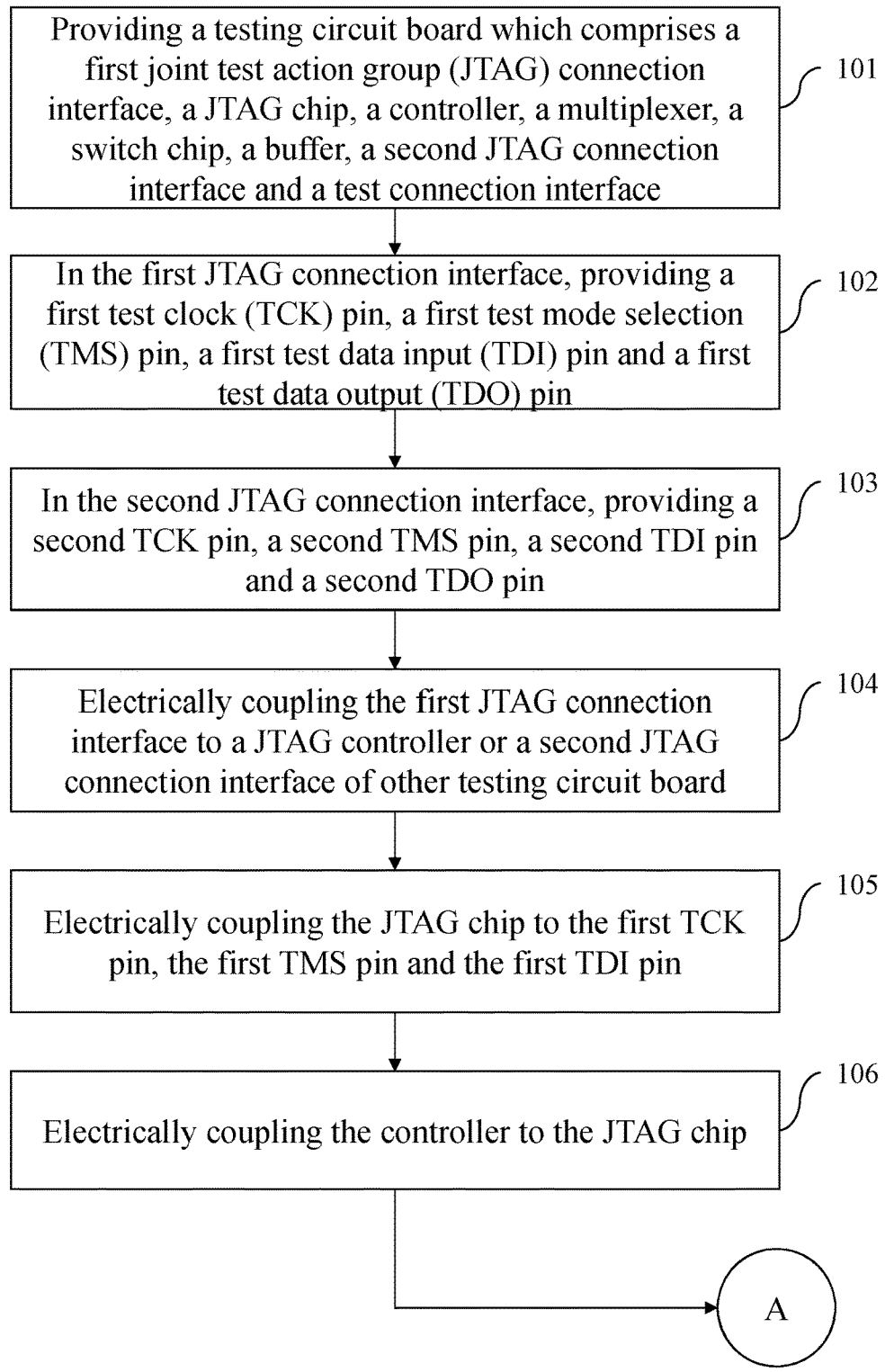
FIGS. 3A-3C are flowcharts showing the steps in operations of the self-detection method applicable to the testing circuit board with the self-detection function, in accordance with the present disclosure.
Figure 3B:
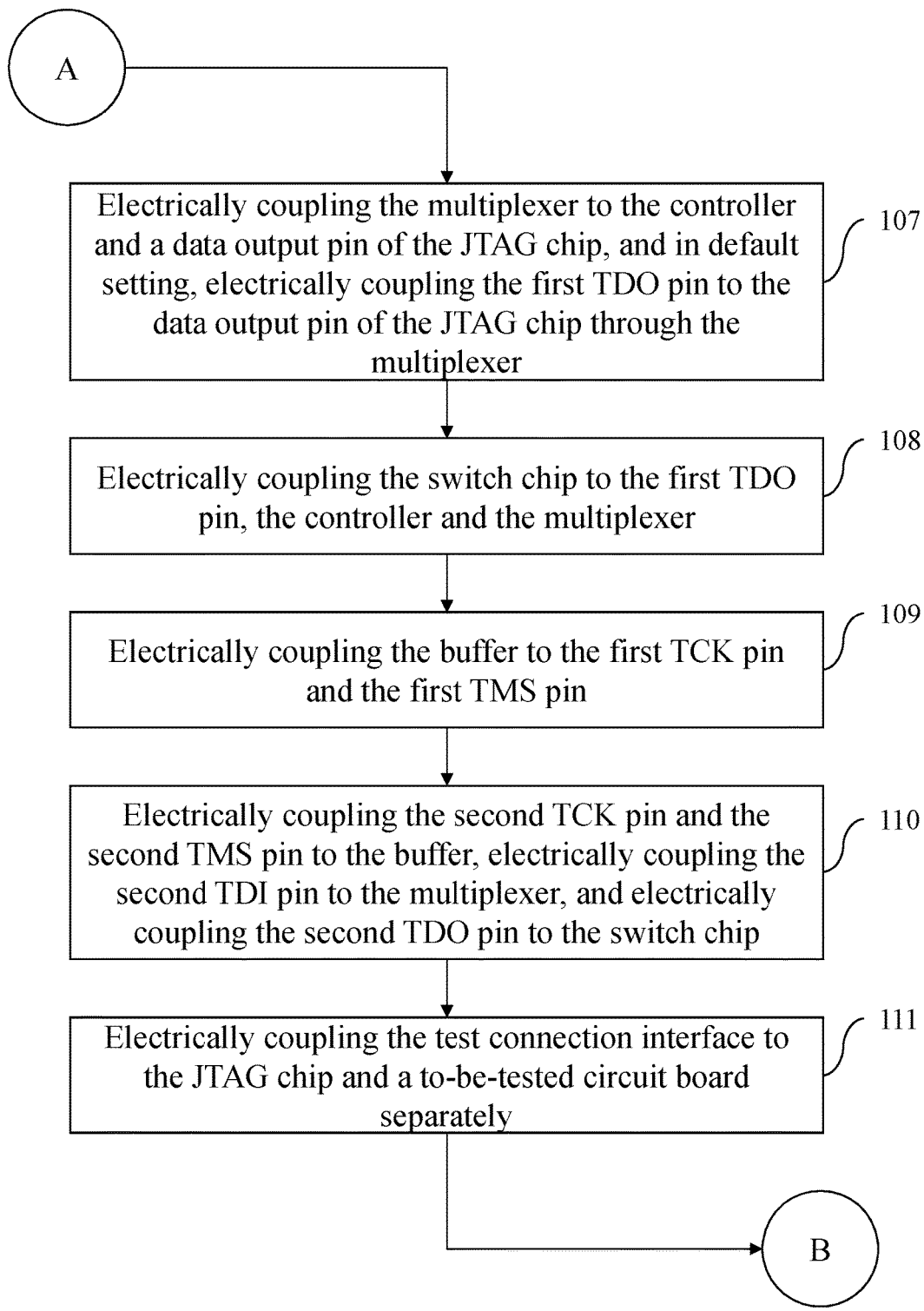
Figure 3C:
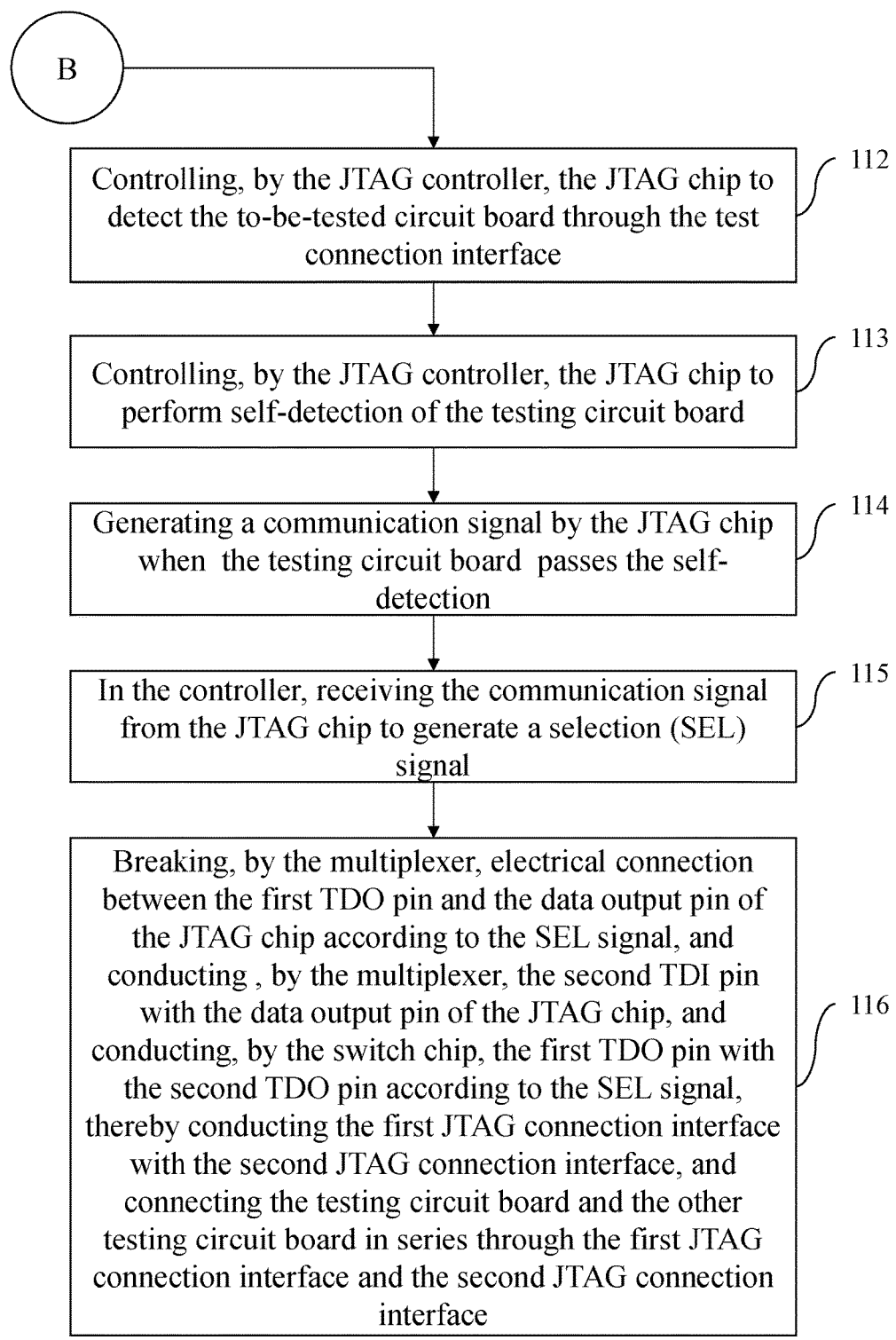

The following refers to FIGS. 1, 2 and 3A-3C for illustration of the testing circuit board with self-detection function, and the self-detection method of the present disclosure. FIG. 1 is a block diagram of the testing circuit board of the present disclosure, FIG. 2 is a circuit schematic diagram of the testing circuit board of the present disclosure, and FIGS. 3A-3C are flowcharts showing the steps in operations of the self-detection method of the present disclosure.

In the present disclosure, the testing circuit board 10 of the self-detection function includes a first joint test action group (JTAG) connection interface 11, a JTAG chip 12, a controller 13, a multiplexer (MUX) 14, a switch chip 15, a buffer 16, a second JTAG connection interface 17 and a test connection interface 18 (in a step 101). The first JTAG connection interface 11 includes a first test clock (TCK) pin 111, a first test mode select (TMS) pin 112, a first test data input (TDI) pin 113, and a first test data output (TDO) pin 114 (in the step 102). The second JTAG connection interface 17 includes a second TCK pin 171, a second TMS pin 172, a second TDI pin 173, and a second TDO pin 174 (in a step 103).

The first JTAG connection interface 11 is configured to electrically couple the JTAG controller 20 or other testing circuit board 10 (in a step 104). The second JTAG connection interface 17 is configured to electrically couple the other testing circuit board 10, so that the testing circuit boards 10 may be connected with each other in series.

For example, the first JTAG connection interface 11 of the first testing circuit board is electrically coupled to the JTAG controller 20, the second JTAG connection interface 17 of the first testing circuit board is electrically coupled to the first JTAG connection interface 11 of the second testing circuit board, the second JTAG connection interface 17 of the second testing circuit board is electrically coupled to the first JTAG connection interface 11 of the third testing circuit board, and so forth. As a result, the testing circuit boards 10 are connected in series.

The JTAG chip 12 is electrically coupled to the first TCK pin 111, the first TMS pin 112 and the first TDI pin 113 (in a step 105). The JTAG controller 20 is configured to control the JTAG chip 12 to perform self-detection of the testing circuit board 10 (in a step 113), and when the testing circuit board 10 passes the self-detection, the JTAG chip 12 generates a communication signal (in a step 114).

Figure 4:
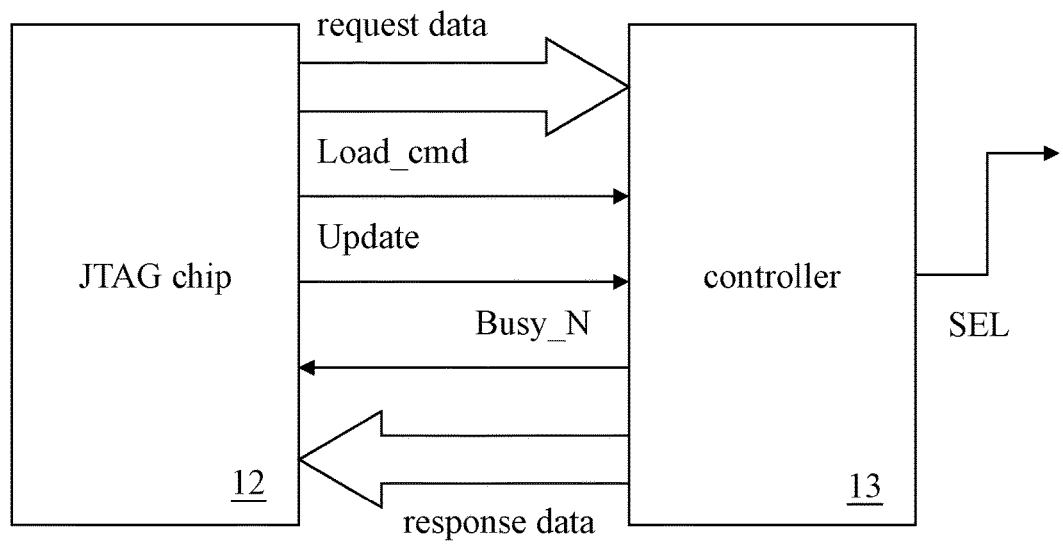
FIG. 4 is a schematic view of a communication protocol for a controller and a JTAG chip of the testing circuit board with the self-detection function, in accordance with the present disclosure.

The controller 13 is electrically coupled to the JTAG chip 12 (in a step 106). The JTAG chip 12 communicates with the controller 13 by a self-defined communication protocol which uses 8 request data pins, 8 response data pins, a load command (Load_cmd) pin, an update pin, and a busy setting (Busy N) pin. Please refer to FIG. 4, which is schematic view of the communication protocol used between the controller and the JTAG chip of the testing circuit board of the present disclosure. The controller 13 may receive the communication signal from the JTAG chip 12 to generate a selection (SEL) signal.

The following is a communication process of the self-defined communication protocol between the JTAG chip 12 and the controller 13. For the JTAG chip 12 and the controller 13, the request data pin works only when the Load_cmd pin is set to a low logic level; when the update pin is at a high logic level, the controller 13 may read the request data pin and set the Busy_N pin as valid (that is, the controller 13 is busy). When the JTAG chip 12 checks that the Busy_N pin is valid, it indicates that the controller 13 receives the instruction successfully, and the JTAG chip 12 then sets the update pin to the low logic level and sets the Load_cmd pin to the high logic level. After the controller 13 completes the corresponding operation, the controller 13 sets the response data pin, and sets the Busy N pin as invalid, it indicates that the controller 13 has completed the instruction already and is at an idle state, so that the JTAG chip 12 may read the state of the controller 13.

The multiplexer 14 is electrically coupled to the data output pin of the JTAG chip 12 and the controller 13. In default setting, the first TDO pin 114 is electrically coupled to the data output pin of the JTAG chip 12 through the multiplexer 14 (in a step 107), and the switch chip 15 is electrically coupled to the first TDO pin 114, the controller 13, and the multiplexer 14 (in a step 108). The buffer 16 is electrically coupled to the first TCK pin 111, the first TMS pin 112, the second TCK pin 171, and the second TMS pin 172 (in steps 109 and 110). The buffer 16 is configured to improve signal strength and anti-interference of the signals of the first TCK pin 111, the first TMS pin 112, the second TCK pin 171, and the second TMS pin 172, thereby preventing from interference caused by signal reflection from other testing circuit board 10.

The second TDI pin 113 is electrically coupled to the multiplexer 14, and the second TDO pin 114 is electrically coupled to the switch chip 15 (in a step 110). After the testing circuit board 10 passes the self-detection, the JTAG chip 12 generates the communication signal, and upon receipt of the communication signal from the JTAG chip 12, the controller 13 may generate the SEL signal (in a step 115). The multiplexer 14 may receive the SEL signal from the controller 13, and then break the electrical connection between the first TDO pin and the data output pin of the JTAG chip according to the SEL signal, and conduct the second TDI pin 173 with the data output pin of the JTAG chip 12. When the switch chip 15 receives the SEL signal from the controller 13, the switch chip 15 may conduct the first TDO pin 114 with the second TDO pin 174 according to the SEL signal, so that the first JTAG connection interface 11 is conducted with the second JTAG connection interface 17, and the testing circuit boards 10 are connected in series through the first JTAG connection interface 11 and the second JTAG connection interface 17 (in a step 116).

The JTAG controller 20 controls the JTAG chip 12, by boundary scan technology, to detect a to-be-tested circuit board or perform the self-detection of the testing circuit board 10. When the self-detection of the testing circuit board is started, the JTAG controller 20 resets a boundary scan chain of the JTAG chip 12, and the JTAG controller 20 then scans an ID code of the JTAG chip 12, and then determines whether the ID code of the JTAG chip 12 is valid, and pushes a boundary scan sample and a huge amount of data by the boundary scan technology, and then determines whether the output result is consistent, thereby detecting stability of the JTAG boundary scan chain and performing the self-detection of the testing circuit board.

The test connection interface 18 is electrically coupled to the to-be-tested circuit board and the JTAG chip 12 separately (in a step 111). The test connection interface 18 is plugged in the to-be-tested circuit board for electrical connection, so that the JTAG controller 20 may control the JTAG chip 12 to detect the to-be-tested circuit board (in a step 112).

To summarize, the difference between the present disclosure and the conventional technology is that the testing circuit board and self-detection method thereof of the present disclosure use the JTAG chip to detect the to-be-tested circuit board and perform the self-detection of the testing circuit board, and when the testing circuit board passes the self-detection, the first JTAG connection interface is conducted with the second JTAG connection interface through the controller, the multiplexer, and the switch chip, thereby connecting the testing circuit boards in series.

By using above technical means, the conventional technology problem that that existing series connection of the JTAG chip is inconvenient and time-consuming to detect faulty chip may be solved, and the technical effect of conveniently and quickly connecting the JTAG chip in series for self-detection may be achieved.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. A testing circuit board with self-detection function, comprising:
   a first joint test action group (JTAG) connection interface configured to be electrically coupled to a JTAG controller or other testing circuit board, and comprising a first test clock (TCK) pin, a first test mode selection (TMS) pin, a first test data input (TDI) pin and a first test data output (TDO) pin;
   a JTAG chip electrically coupled to the first TCK pin, the first TMS pin and the first TDI pin, wherein a JTAG controller controls the JTAG chip to perform self-detection of the testing circuit board, and when the testing circuit board passes the self-detection, the JTAG chip generates a communication signal;
   a controller electrically coupled to the JTAG chip;
   a multiplexer electrically coupled to a data output pin of the JTAG chip and the controller, wherein in default setting, the first TDO pin is electrically coupled to the data output pin of the JTAG chip through the multiplexer;
   a switch chip electrically coupled to the first TDO pin, the controller and the multiplexer;
   a buffer electrically coupled to the first TCK pin and the first TMS pin; and
   a second JTAG connection interface configured to be electrically coupled to the first JTAG connection interface of other testing circuit board, and comprising a second TCK pin, a second TMS pin, a second TDI pin and a second TDO pin, wherein the second TCK pin and the second TMS pin are electrically coupled to the buffer, the second TDI pin is electrically coupled to the multiplexer, and the second TDO pin is electrically coupled to the switch chip; and a test connection interface electrically coupled to the JTAG chip and a to-be-tested circuit board separately, wherein the JTAG chip detects the to-be-tested circuit board through the test connection interface;

wherein, after the JTAG chip generates the communication signal, the controller receives the communication signal from the JTAG chip to generate a selection (SEL) signal, and the multiplexer breaks electrical connection between the first TDO pin and the data output pin of the JTAG chip, and conducts the second TDI pin with the data output pin of the JTAG chip according to the SEL signal, and the switch chip conducts the first TDO pin with the second TDO pin according to the SEL signal, so that the first JTAG connection interface is conducted with the second JTAG connection interface, the testing circuit board and the other testing circuit board are connected in series through the first JTAG connection interface and the second JTAG connection interface.

2. The testing circuit board according to claim 1, wherein the JTAG controller controls the JTAG chip, by boundary scan technology, to detect the to-be-tested circuit board or perform the self-detection of the testing circuit board.

3. The testing circuit board according to claim 2, the JTAG controller scans an ID code of the JTAG chip to detect stability of a JTAG boundary scan chain.

4. The testing circuit board according to claim 3, wherein the JTAG controller resets a boundary scan chain of the JTAG chip, and reads the ID code of the JTAG chip and determines whether the ID code is consistent, and pushes a boundary scan sample and a huge amount of data, by the boundary scan technology, to determine whether an output result is consistent, thereby performing the self-detection of the testing circuit board.

5. The testing circuit board according to claim 1, wherein the buffer is configured to improve signal strength and anti-interference of the signals transmitted from the first TCK pin, the first TMS pin, the second TCK pin and the second TMS pin, thereby preventing from interference caused by signal reflection from other testing circuit board.

6. A self-detection method for a testing circuit board with self-detection function, comprising:

providing a testing circuit board which comprise a first joint test action group (JTAG) connection interface, a JTAG chip, a controller, a multiplexer, a switch chip, a buffer, a second JTAG connection interface and a test connection interface;

in the first JTAG connection interface, providing a first test clock (TCK) pin, a first test mode selection (TMS) pin, a first test data input (TDI) pin and a first test data output (TDO) pin;

in the second JTAG connection interface, providing a second TCK pin, a second TMS pin, a second TDI pin and a second TDO pin;

electrically coupling the first JTAG connection interface to a JTAG controller or a second JTAG connection interface of other testing circuit board;

electrically coupling the JTAG chip to the first TCK pin, the first TMS pin and the first TDI pin;

electrically coupling the controller to the JTAG chip;

electrically coupling the multiplexer to the controller and a data output pin of the JTAG chip, wherein in default setting, the first TDO pin is electrically coupled to the data output pin of the JTAG chip through the multiplexer;

electrically coupling the switch chip to the first TDO pin, the controller and the multiplexer;

electrically coupling the buffer to the first TCK pin and the first TMS pin;

electrically coupling the second TCK pin and the second TMS pin to the buffer, electrically coupling the second TDI pin to the multiplexer, and electrically coupling the second TDO pin to the switch chip;

electrically coupling the test connection interface to the JTAG chip and a to-be-tested circuit board separately;

controlling, by the JTAG controller, the JTAG chip to detect the to-be-tested circuit board through the test connection interface;

controlling, by the JTAG controller, the JTAG chip to perform self-detection of the testing circuit board;

generating a communication signal by the JTAG chip when the testing circuit board passes the self-detection;

in the controller, receiving the communication signal from the JTAG chip to generate a selection (SEL) signal; and breaking, by the multiplexer, electrical connection between the first TDO pin and the data output pin of the JTAG chip according to the SEL signal, and conducting, by the multiplexer, the second TDI pin with the data output pin of the JTAG chip, and conducting, by the switch chip, the first TDO pin with the second TDO pin according to the SEL signal, thereby conducting the first JTAG connection interface with the second JTAG connection interface, and connecting the testing circuit board and the other testing circuit board in series through the first JTAG connection interface and the second JTAG connection interface.

7. The self-detection method according to claim 6, wherein the JTAG controller controls the JTAG chip, by boundary scan technology, to detect the to-be-tested circuit board or perform the self-detection of the testing circuit board.

8. The self-detection method according to claim 7, wherein the JTAG controller scans an ID code of the JTAG chip to detect stability of a JTAG boundary scan chain.

9. The self-detection method according to claim 8, wherein the JTAG controller resets a boundary scan chain of the JTAG chip, and reads the ID code of the JTAG chip and determines whether the ID code is consistent, and pushes a boundary scan sample and a huge amount of data, by the boundary scan technology, to determine whether an output result is consistent, thereby performing the self-detection of the testing circuit board.

10. The self-detection method according to claim 6, wherein the buffer is configured to improve signal strength and anti-interference of the signals transmitted from the first TCK pin, the first TMS pin, the second TCK pin and the second TMS pin, thereby preventing from interference caused by signal reflection from other testing circuit board.

* * * * *